United States Patent
Takeuchi et al.

(10) Patent No.: US 9,614,498 B2
(45) Date of Patent: Apr. 4, 2017

(54) ACTIVE BALUN CIRCUIT AND TRANSFORMER

(71) Applicant: MITSUBISHI ELECTRIC CORPORATION, Chiyoda-ku, Tokyo (JP)

(72) Inventors: Ryosuke Takeuchi, Tokyo (JP); Koji Tsutsumi, Tokyo (JP); Takayuki Nakai, Tokyo (JP); Eiji Taniguchi, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 15/103,403

(22) PCT Filed: Feb. 26, 2014

(86) PCT No.: PCT/JP2014/054692
§ 371 (c)(1),
(2) Date: Jun. 10, 2016

(87) PCT Pub. No.: WO2015/128965
PCT Pub. Date: Sep. 3, 2015

(65) Prior Publication Data
US 2016/0315599 A1     Oct. 27, 2016

(51) Int. Cl.
*H03H 11/32*     (2006.01)
*H03H 11/18*     (2006.01)

(52) U.S. Cl.
CPC .............. *H03H 11/32* (2013.01); *H03H 11/18* (2013.01)

(58) Field of Classification Search
CPC .......... H03H 7/42; H03H 11/32; H03H 11/04; H03H 11/20
(Continued)

(56) References Cited

U.S. PATENT DOCUMENTS

| 4,942,868 A | 7/1990 | Vago |
| 5,048,520 A | 9/1991 | Vago |

(Continued)

FOREIGN PATENT DOCUMENTS

| JP | 6-237975 A | 8/1994 |
| JP | 2000-165202 A | 6/2000 |

(Continued)

OTHER PUBLICATIONS

International Search Report (PCT/ISA/210) issued on May 20, 2014, by the Japanese Patent Office as the International Searching Authority for International Application No. PCT/JP2014/054692.

*Primary Examiner* — John Poos
(74) *Attorney, Agent, or Firm* — Buchanan Ingersoll & Rooney PC

(57) ABSTRACT

An active balun circuit includes a CG transistor having a source terminal thereof connected to an input terminal and a gate terminal thereof grounded, a CS transistor having a gate terminal thereof connected to the input terminal and a source terminal thereof grounded, an asymmetrical transformer, a first output terminal, and a second output terminal. The asymmetrical transformer includes a primary coil and a secondary coil. The primary coil includes a first inductor connected to the CG transistor and a second inductor connected to the CS transistor. The secondary coil includes a third inductor associated with the first inductor and a fourth inductor associated with the second inductor. The first output terminal outputs a first signal generated at the third inductor, and the second output terminal outputs a second signal generated at the fourth inductor.

14 Claims, 5 Drawing Sheets

(58) Field of Classification Search
USPC ............... 327/105, 355, 359, 555, 559, 231; 333/24 R, 25, 26, 125, 127
See application file for complete search history.

(56) References Cited

U.S. PATENT DOCUMENTS

| | | | |
|---|---|---|---|
| 5,178,134 | A | 1/1993 | Vago |
| 5,305,737 | A | 4/1994 | Vago |
| 5,665,141 | A | 9/1997 | Vago |
| 6,150,852 | A | 11/2000 | Aparin |
| 6,259,325 | B1 * | 7/2001 | Ishizuka ............. H01F 17/0006 330/301 |
| 2004/0095783 | A1 * | 5/2004 | Tani .................... H02M 3/3385 363/16 |
| 2014/0125126 | A1 | 5/2014 | Akizuki et al. |

FOREIGN PATENT DOCUMENTS

| | | |
|---|---|---|
| JP | 2002-535864 A | 10/2002 |
| JP | 2004-320358 A | 11/2004 |
| JP | 2005-244000 A | 9/2005 |
| JP | 4226376 B | 2/2009 |
| JP | 2013-118623 A | 6/2013 |
| WO | WO 2013/014881 A1 | 1/2013 |

* cited by examiner

ACTIVE BALUN CIRCUIT AND TRANSFORMER

TECHNICAL FIELD

The present invention relates to an active balun circuit that is a balun circuit using active elements (active elements) and a transformer included by this active balun circuit.

BACKGROUND ART

FIG. 7 is a circuit diagram illustrating a configuration of an active balun circuit for comparison.

The circuit illustrated in FIG. 7 is an example of the active balun circuit to generate differential signals having phases of 180 degrees and 0 degrees from a single-end high frequency signal received through an antenna in a high frequency circuit (see Patent Literature 1).

In this active balun circuit, an output of a CG (common·Gate) transistor 4 having a gate thereof grounded, which has been obtained from an input signal at an input terminal 1, is phase-adjusted by a transistor 5, thereby outputting a signal with a phase of 0 degrees to an output terminal 2. Further, an output of a CS (common·Source) transistor 6 having a source thereof grounded, which has been obtained from the input signal at the input terminal 1, is output to an output terminal 3 as an inverted signal with a phase of 180 degrees. Differential signals are thereby obtained.

CITATION LIST

Patent Literature

Patent Literature 1: JP 4226376

SUMMARY OF INVENTION

Technical Problem

In the prior art, the transistor 5 (MOS FET) is added to the active balun circuit having a basic CG-CS (common·Gate-common·Source) configuration, thereby avoiding a deviation of the phases in a wide frequency band.

In the configuration in FIG. 7, the phase at the output terminal 2 needs to be accurately detected, and the phase at the output terminal 2 needs to be controlled to be 180 degrees out of the phase at the output terminal 3 (inverted phase).

However, due to variations in the capacity of the circuit and transistor threshold voltages, it is difficult to make accurate phase adjustment in a high-frequency region in particular. Further, in the configuration in FIG. 7, with respect to noise as well that will occur in the balun circuit, no consideration is given to reduction of the noise.

As mentioned above, in the configuration in FIG. 7, there is a problem that control of a reference potential of the (MOS FET) transistor 5 is complex and therefore it is difficult to execute phase deviation control. Further, there is a problem that a noise characteristic that will affect a radio characteristic cannot be improved.

The present invention has been made in order to solve the problems as mentioned above. It is an object of the present invention to obtain differential signals accurately maintaining 180 degrees out of phase and having no amplitude difference and low noise in an active balun circuit of a CG-CS configuration, without making sensitive phase adjustment.

Solution to Problem

An active balun circuit according to the present invention is an active balun circuit to output a first signal and a second signal having a phase that is deviated from a phase of the first signal by 180 degrees, based on a single-ended signal input through an input terminal. The active balun circuit may include:

a first field effect transistor having a source terminal thereof connected to the input terminal and a gate terminal thereof grounded;

a second field effect transistor having a gate terminal thereof connected to the input terminal and a source terminal thereof grounded;

a transformer including:
a primary coil including a first coil connected to a drain terminal of the first field effect transistor and a second coil connected to a drain terminal of the second field effect transistor; and
a secondary coil including a third coil associated with the first coil and a fourth coil associated with the second coil;

a first output terminal connected to the third coil to output a signal generated at the third coil, as the first signal; and a second output terminal connected to the fourth coil to output a signal generated at the fourth coil, as the second signal.

Advantageous Effects of Invention

The active balun circuit according to the present invention includes the transformer, the first output terminal to output the signal generated at the third coil, as the first signal, and the second output terminal to output the signal generated at the fourth coil, as the second signal. The transformer includes the primary coil and the secondary coil. The primary coil includes the first coil connected to the drain terminal of the first field effect transistor and the second coil connected to the drain terminal of the second field effect transistor. The secondary coil includes the third coil associated with the first coil and the fourth coil associated with the second coil. Thus, the signals that are differential may be extracted from a secondary side, using the primary coil of the transformer as a load element for active elements in an input stage. Therefore, there is obtained an effect that errors in amplitudes and a phase difference may be reduced and occurrence of noise at each of the active elements in the input stage may be reduced.

DESCRIPTION OF EMBODIMENTS

Embodiment 1

Figure 1:
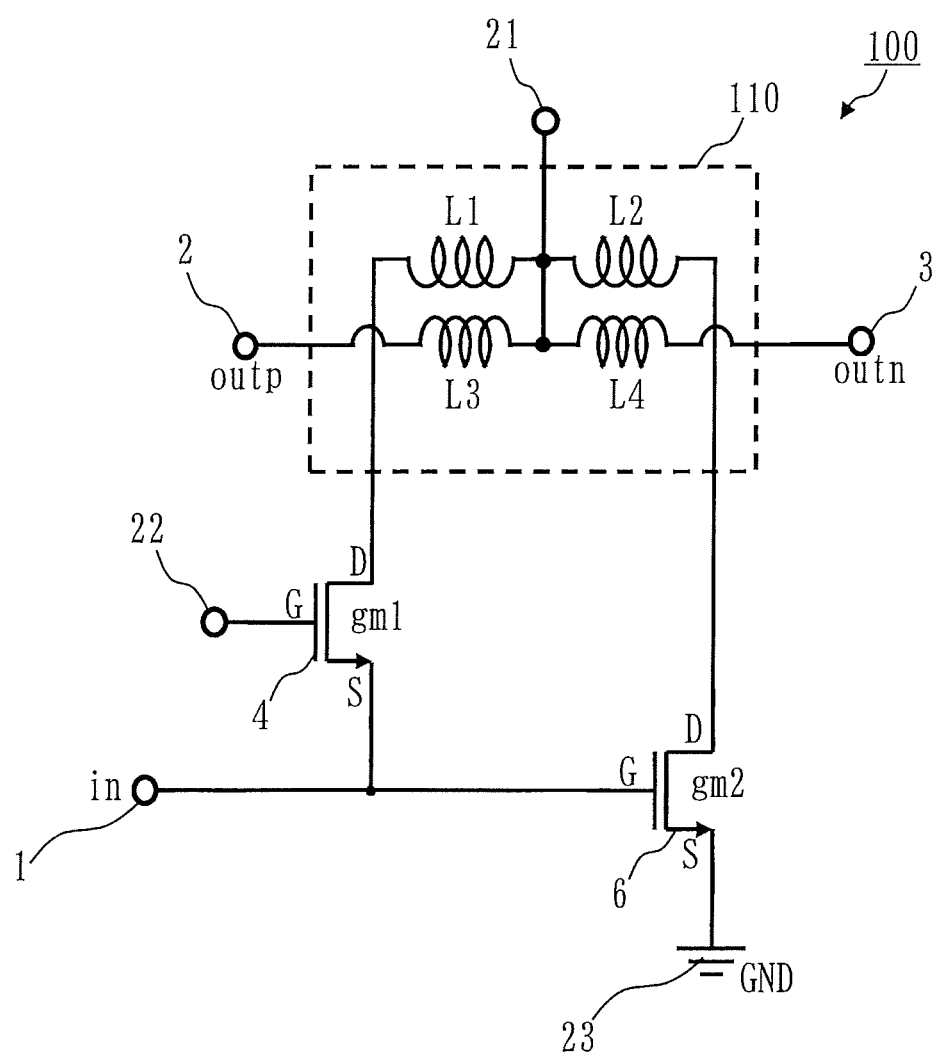
FIG. 1 is a circuit diagram illustrating a configuration of an active balun circuit 100 according to Embodiment 1.

FIG. 1 is a circuit diagram illustrating a configuration of an active balun circuit 100 according to this embodiment. Using FIG. 1, the circuit configuration of the active balun circuit 100 according to this embodiment will be described.

The active balun circuit 100 outputs a first signal from an output terminal 2 and outputs, from an output terminal 3, a second signal whose phase is deviated from the phase of the first signal by 180 degrees, based on a single-ended signal input through an input terminal 1. The first signal and the second signal constitute differential signals generated from the single-ended signal.

The active balun circuit 100 according to this embodiment has the configuration that will be described below in (1) to (6).

(1) The active balun circuit 100 includes an input stage where a source terminal of a gate-grounded transistor 4 (hereinafter referred to as a CG transistor 4) is connected to the input terminal 1 and a gate terminal of a source-grounded transistor 6 (hereinafter referred to as a CS transistor 6) is connected to the input terminal 1. The single-ended signal is input to the input terminal 1.

The CG transistor 4 is an example of a gate-grounded first field effect transistor whose source terminal is connected to the input terminal 1 and whose gate terminal is used as a common terminal (grounded). The CS transistor 6 is an example of a source-grounded second field effect transistor whose gate terminal is connected to the input terminal 1 and whose source terminal is used as the common terminal (grounded).

(2) The active balun circuit 100 includes an asymmetrical transformer 110. The asymmetrical transformer 110 includes an inductor L1 (first coil) and an inductor L2 (second coil) on a primary side (primary coil). The active balun circuit 100 includes, on a secondary side (secondary coil), an inductor L3 (third coil) associated with the inductor L1 and an inductor L4 (fourth coil) associated with the inductor L2. A drain terminal of the CG transistor 4 is connected to the inductor L1 of the asymmetrical transformer 110, and a drain terminal of the CS transistor 6 is connected to the inductor L2 of the asymmetrical transformer 110.

The asymmetrical transformer 110 is an example of a transformer including the primary side (primary coil) and the secondary side (secondary coil).

(3) The gate terminal of the CG transistor 4 is connected to a ground (GND) or a bias terminal 22, and the CG transistor 4 has a transconductance of gm1. The source terminal of the CS transistor 6 is connected to the GND or a bias terminal 23, and the CS transistor 6 has a transconductance of gm2. A ratio between gm1 and gm2 is set to 1:N. Herein, N ranges from 2 to 10.

(4) An inductor value of the inductor L1 of the asymmetrical transformer 110 is indicated by $L_1$, an inductor value of the inductor L2 of the asymmetrical transformer 110 is indicated by $L_2$, an inductor value of the inductor L3 of the asymmetrical transformer 110 is indicated by $L_3$, and an inductor value of the inductor L4 of the asymmetrical transformer 110 is indicated by $L_4$. Herein, a ratio between $L_1$ and $L_2$ is set to n:1. n is a natural number. Preferably, the value of n ranges from 2 to 10.

(5) The inductor L3 on the secondary side of the asymmetrical transformer 110 is connected to the output terminal 2 for a differential signal. The inductor L4 on the secondary side of the asymmetrical transformer 110 is connected to the output terminal 3 for a differential signal.

The output terminal 2 is an example of a first output terminal to output a signal generated at the inductor L3, as a first signal. The output terminal 3 is an example of a second output terminal to output a signal generated at the inductor L4, as a second signal.

(6) A side not connected to the CG transistor 4, the CS transistor 6, and the output terminals 2 and 3 in the asymmetrical transformer 110 is connected to a bias terminal 21. The bias terminal 21 may be the one for a power supply voltage.

Now, an operation for noise reduction in the active balun circuit 110 according to this embodiment will be described.

Referring to FIG. 1, noise generated at the CG transistor 4 is cancelled by a differential signal output. This is because the noise at the CG transistor 4 is cancelled by noise inverted by 180 degrees by the CS transistor 6.

Accordingly, reduction of the noise generated by the CS transistor 6 will lead to effective noise reduction in the active balun circuit 100.

In order to reduce the noise generated by the CS transistor 6, it is necessary to increase the transconductance of gm2 of the CS transistor 6. That is, increasing the size of the CS transistor 6 leads to reduction of the noise.

It is necessary for the transconductance of gm1 of the CG transistor 4 to take matching with an impedance (Rs) of an input side. Thus, the transconductance of gm1 takes a certain value such that gm1=1/Rs. Consequently, when the transconductance of gm2 of the CS transistor 6 is to be increased, a relationship between the transconductances of gm1 and gm2 naturally becomes gm2>gm1.

In order to increase the transconductance of gm2 of the CS transistor 6, the ratio between gm1 and gm2 is set to 1:N. N is set to a natural number.

When values of signal currents that flow through the CG transistor 4 and the CS transistor 6 are respectively indicated by $i_1$ and $i_2$, $i_1:i_2=1:N$ holds because gm1:gm2=1:N. Thus, the values of the signal currents become asymmetrical signal current values.

The value $i_2$ of the signal current that flows through the CS transistor 6 is larger than the value $i_1$ of the signal current that flows through the CG transistor 4. Specifically, it is preferable that the value $i_2$ of the current that flows through the CS transistor 6 be within a range from twice to ten times the value $i_1$ of the signal current that flows through the CG transistor 4.

An impedance of the inductor L1 on the primary side of the asymmetrical transformer 110 is indicated by Z1, and an impedance of the inductor L2 on the primary side of the asymmetrical transformer 110 is indicated by Z2. It is necessary to set a relationship between the impedances of Z1 and Z2 on the primary side of the asymmetrical transformer 110 to be Z1:Z2=N:1 in order to equalize amplitudes of voltages of the signals generated at L1 and L2. Accordingly, when a resistive element is used for a load impedance, noise at the resistance element of the impedance Z1 may increase.

In this embodiment; however, the load impedance is implemented by employing the coil for the primary side of the asymmetrical transfer 110. Thus, the increase in the noise may be avoided. This is because noise of the coil is smaller than the noise of the resistive element.

Accordingly, by setting $L_1 > L_2$ on the primary side of the asymmetrical transformer 110, an increase in the noise of the resistance may be avoided to achieve Z1:Z2=N:1.

As described above, the inductor value $L_1$ of the first coil is larger than the inductor value $L_2$ of the second coil. Specifically, it is preferable that the inductor value $L_1$ of the first coil be within a range from twice to ten times the inductor value $L_2$ of the second coil.

Figure 2:
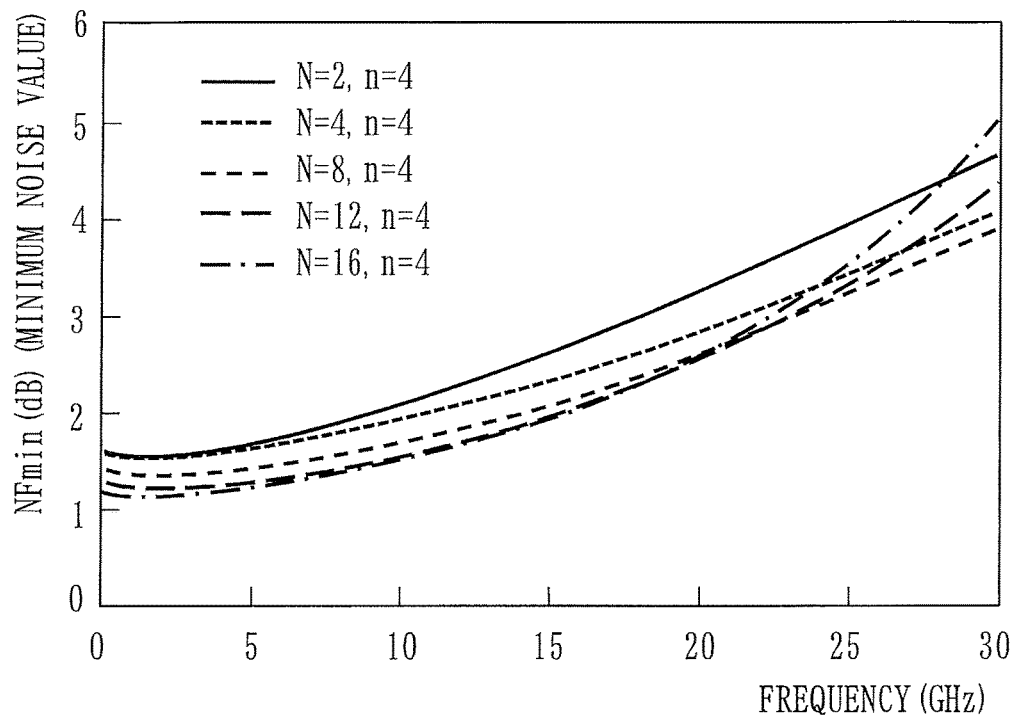
FIG. 2 includes graphs illustrating frequency characteristics and noise characteristics of differential signals in the active balun circuit 100 according to Embodiment 1.

FIG. 2 includes graphs illustrating frequency and noise characteristics of the differential signals in the active balun circuit 100 according to this embodiment.

When the value of n is set to be fixed (herein n=4) as illustrated in FIG. 2, NF (noise) decreases due to an increase of N. However, the characteristic at a high frequency deteriorates. Thus, it is necessary to select appropriate N. Preferably, a value of N ranges from 2 to 10. Specifically, it is preferable that the value of N range from 4 to 8. Optimally, the value of N is 8.

Figure 3:
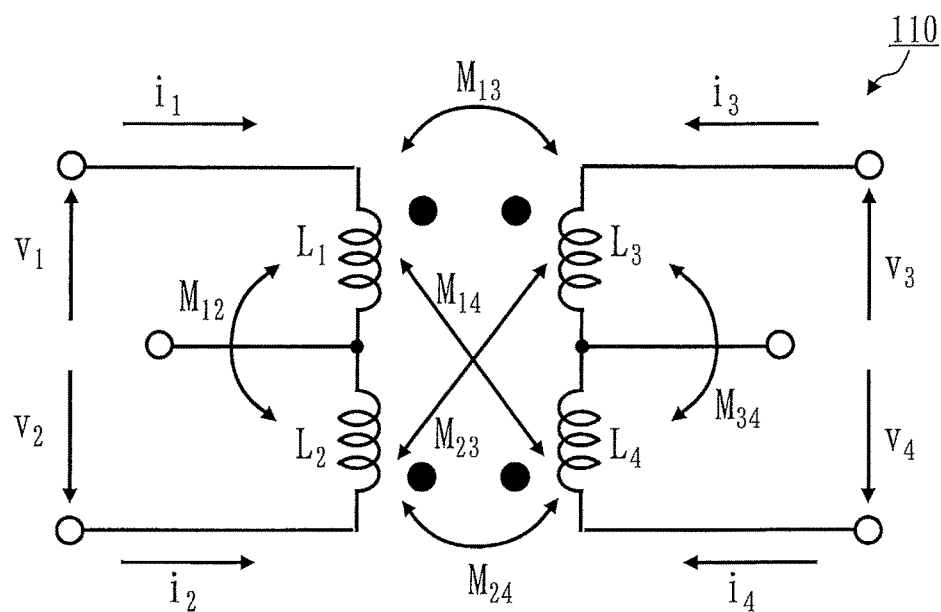
FIG. 3 is a diagram illustrating a simplified equivalent circuit of an asymmetrical transformer 110 according to Embodiment 1.

FIG. 3 is a diagram illustrating a simplified equivalent circuit of the asymmetrical transformer 110 according to this embodiment.

Using FIG. 3, a description will be given about an operation of generating differential signal currents at the inductors L3 and L4 on the secondary side by a magnetic field generated by the currents on the primary side of the asymmetrical transformer.

Respective voltages of the inductors L1, L2, L3, and L4 are indicated by $v_1$, $v_2$, $v_3$, and $v_4$. Respective currents of the inductors L1, L2, L3, and L4 are indicated by $i_1$, $i_2$, $i_3$, and $i_4$. A mutual inductance is indicated by $M_{mn}$. m and n each take one of values of 1, 2, 3, and 4. To take an example, $M_{12}$ means the mutual inductance between L1 and L2.

Relationships between the currents and the voltages in the simplified equivalent circuit of the asymmetrical transformer 110 illustrated in FIG. 3 are expressed by Expression 1:

[Math 1]

$$v_1 = L_1 \frac{di_1}{dt} - M_{12}\frac{di_2}{dt} + M_{13}\frac{di_3}{dt} - M_{14}\frac{di_4}{dt}$$

$$v_2 = -M_{12}\frac{di_1}{dt} + L_2\frac{di_2}{dt} - M_{23}\frac{di_3}{dt} + M_{24}\frac{di_4}{dt}$$

$$v_3 = M_{13}\frac{di_1}{dt} - M_{23}\frac{di_2}{dt} + L_3\frac{di_3}{dt} - M_{34}\frac{di_4}{dt}$$

$$v_4 = -M_{14}\frac{di_1}{dt} + M_{24}\frac{di_2}{dt} - M_{34}\frac{di_3}{dt} + L_4\frac{di_4}{dt}$$

(Expression 1)

A relationship between the mutual inductance $M_{mn}$, and a coupling coefficient $k_{mn}$ is expressed by the following Expression 2:

[Math 2]

$$M_{12} = k_{12}\sqrt{L_1 \cdot L_2}$$

$$M_{34} = k_{34}\sqrt{L_3 \cdot L_4}$$

$$M_{13} = k_{13}\sqrt{L_1 \cdot L_3}$$

$$M_{14} = k_{14}\sqrt{L_1 \cdot L_4}$$

$$M_{23} = k_{23}\sqrt{L_2 \cdot L_3}$$

$$M_{24} = k_{24}\sqrt{L_2 \cdot L_4}$$

(Expression 2)

For simplification of the description, the coupling coefficient and the inductor values of the nonasymmetrical transformer 110 are set to be as follows:

It is so set that $k_{12}=k_p$, $K_{34}=k_s$, $k_{mn}=k$ for $K_{mn}$ other than $k_{12}$ and $k_{34}$, $L_1 = nL_p$, $L_2 = L_p$, and $L_3 = L_4 = L_s$.

As mentioned above, preferably, the inductor value $L_3$ of the third coil and the inductor value $L_4$ of the fourth coil are generally equal. By setting $L_3 = L_4$, a phase error and an amplitude error between the first signal and the second signal may be reduced.

Based on the above-mentioned values and Expressions 1 and 2, voltages on the secondary side are given by the following Expression 3:

[Math 3]

$$v_3 = M_{13}\frac{di_1}{dt} - M_{23}\frac{di_2}{dt} + L_3\frac{di_3}{dt} - M_{34}\frac{di_4}{dt}$$

$$= k\sqrt{nL_pL_s}\frac{di_1}{dt} - k\sqrt{L_pL_s}\frac{di_2}{dt} + L_s\frac{di_3}{dt} - k_sL_s\frac{di_4}{dt}$$

$$v_4 = -M_{14}\frac{di_1}{dt} + M_{24}\frac{di_2}{dt} - M_{34}\frac{di_3}{dt} + L_4\frac{di_4}{dt}$$

$$= -k\sqrt{nL_pL_s}\frac{di_1}{dt} + k\sqrt{L_pL_s}\frac{di_2}{dt} - k_sL_s\frac{di_3}{dt} + L_s\frac{di_4}{dt}$$

(Expression 3)

When a current $i_m$ and a voltage $v_m$ are represented by a current $I_m$ and a voltage $V_m$ by phasor representation, the following Expression 4 is obtained. Herein, m=1, 2, 3, or 4, as described above.

[Math 4]

$$V_3 = j\omega k\sqrt{L_pL_s}(\sqrt{n}I_1 - I_2) + j\omega L_sI_3 - j\omega k_sL_sI_4$$

$$V_4 = -j\omega k\sqrt{L_pL_s}(\sqrt{n}I_1 - I_2) - j\omega k_sL_sI_3 + j\omega L_sI_4$$

(Expression 4)

Assume that, herein, a load impedance on an output side is indicated by Zs and it is set that $V_3 = I_3Z_s$ and $V_4 = I_4Z_s$ when input-output transfer characteristics of this asymmetrical transformer are obtained. Then, the following Expression 5 is obtained.

[Math 5]

$$V_3 = j\omega k\sqrt{L_pL_s}(\sqrt{n}I_1 - I_2) + j\omega L_sI_3 - j\omega k_sL_sI_4$$

$$V_4 = -j\omega k\sqrt{L_pL_s}(\sqrt{n}I_1 - I_2) - j\omega k_sL_sI_3 + j\omega L_sI_4$$

(Expression 5)

When Expression 5 is solved for each of $V_3$ and $V_4$, $V_3$ and $V_4$ are as expressed by the following Expression 6:

[Math 6]

$$V_3 = \frac{j\omega k Z_s\sqrt{L_pL_s}}{z_s - j\omega L_s(1-k_s)}(\sqrt{n}\,I_1 - I_2)$$

$$V_4 = -\frac{j\omega k Z_s\sqrt{L_pL_s}}{z_s - j\omega L_s(1-k_s)}(\sqrt{n}\,I_1 - I_2)$$

(Expression 6)

It can be seen from this Expression that use of the asymmetrical transformer 110 may implement a characteristic capable of correcting imbalance between the differential signals.

As described above, the active balun circuit 100 according to this embodiment includes the input stage of the CG-CS configuration. The inductors on the primary side of the transformer that are asymmetrical as load elements are connected, and the differential signals are output from the inductors of the transformer on the secondary side of the transformer that are symmetrical.

According to the active balun circuit 100 in this embodiment, the differential signals accurately maintaining 180 degrees out of phase and having low noise and no amplitude difference may be obtained without carrying out complex and sensitive phase adjustment in the active balun circuit 100 of the CG-CS configuration.

Further, according to the active balun circuit 100 in this embodiment, differential signals with low noise and reduced phase and amplitude errors may be obtained from a high-frequency signal of an antenna in an apparatus for receiving a high frequency of approximately 10 GHz to 40 GHz, in particular.

Embodiment 2

In this embodiment, a difference from Embodiment 1 will be mainly described.

In this embodiment, by assigning same reference numerals to components that are the same as the components described in Embodiment 1, description of the same components may be omitted.

Figure 4:
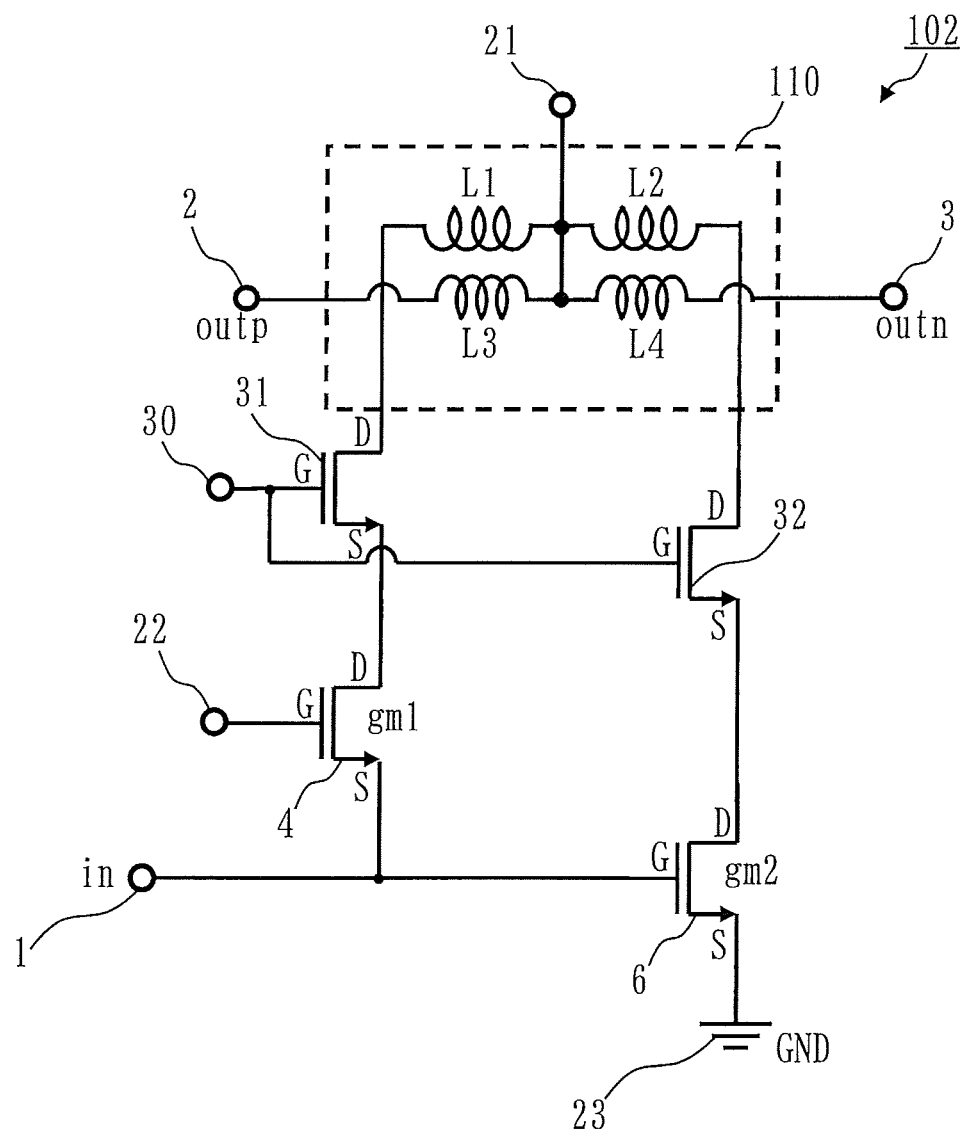
FIG. 4 is a circuit diagram illustrating a configuration of an active balun circuit 102 according to Embodiment 2.

FIG. 4 is a circuit diagram illustrating a configuration of an active balun circuit 102 according to this embodiment.

The active balun circuit 102 illustrated in FIG. 4 has a configuration in which cascode transistors are inserted between the input stage constituted from the CG-CS transistors and the primary side of the asymmetrical transformer in the active balun circuit 100 described in Embodiment 1.

A cascode transistor 31 (example of a third field effect transistor) cascode-connected to the CG transistor 4 is provided between the CG transistor 4 and the inductor L1 (first coil). Further, a cascode transistor 32 (example of a fourth field effect transistor) cascode-connected to the CS transistor 6 is provided between the CS transistor 6 and the inductor L2 (second coil).

A source terminal of the cascode transistor 31 is connected to the drain terminal of the CG transistor 4, a gate terminal of the cascode transistor 31 is connected to a bias terminal 30, and a drain terminal of the cascode transistor 31 is connected to the inductor L1.

A source terminal of the cascode transistor 32 is connected to the drain terminal of the CS transistor 6, a gate terminal of the cascode transistor 32 is connected to the bias terminal 30, and a drain terminal of the cascode transistor 32 is connected to the inductor L2.

There is an effect of allowing an operation at a higher frequency by reducing a mirror effect of the CS transistor 6 by the cascode transistor 32 in FIG. 4. A drain resistance from the load side of the cascode transistor 31 may be equalized with a drain resistance from the load side of the cascode transistor 32, by the cascode transistor 31. Accordingly, the cascode transistor 31 has an effect of equalizing impedances in the input stage from the load sides to reduce imbalance. An appropriate voltage whereby the cascode transistors 31 and 32 operate in a saturated region is supplied to the bias terminal 30.

As mentioned above, according to the active balun circuit 102 in this embodiment, a high-frequency characteristic may be improved by the cascode transistors 31 and 32 that are cascode-connected.

Embodiment 3

In this embodiment, a difference from Embodiments 1 and 2 will be mainly described.

In this embodiment, by assigning same reference numerals to components that are the same as the components described in Embodiments 1 and 2, description of the same components may be omitted.

Figure 5:
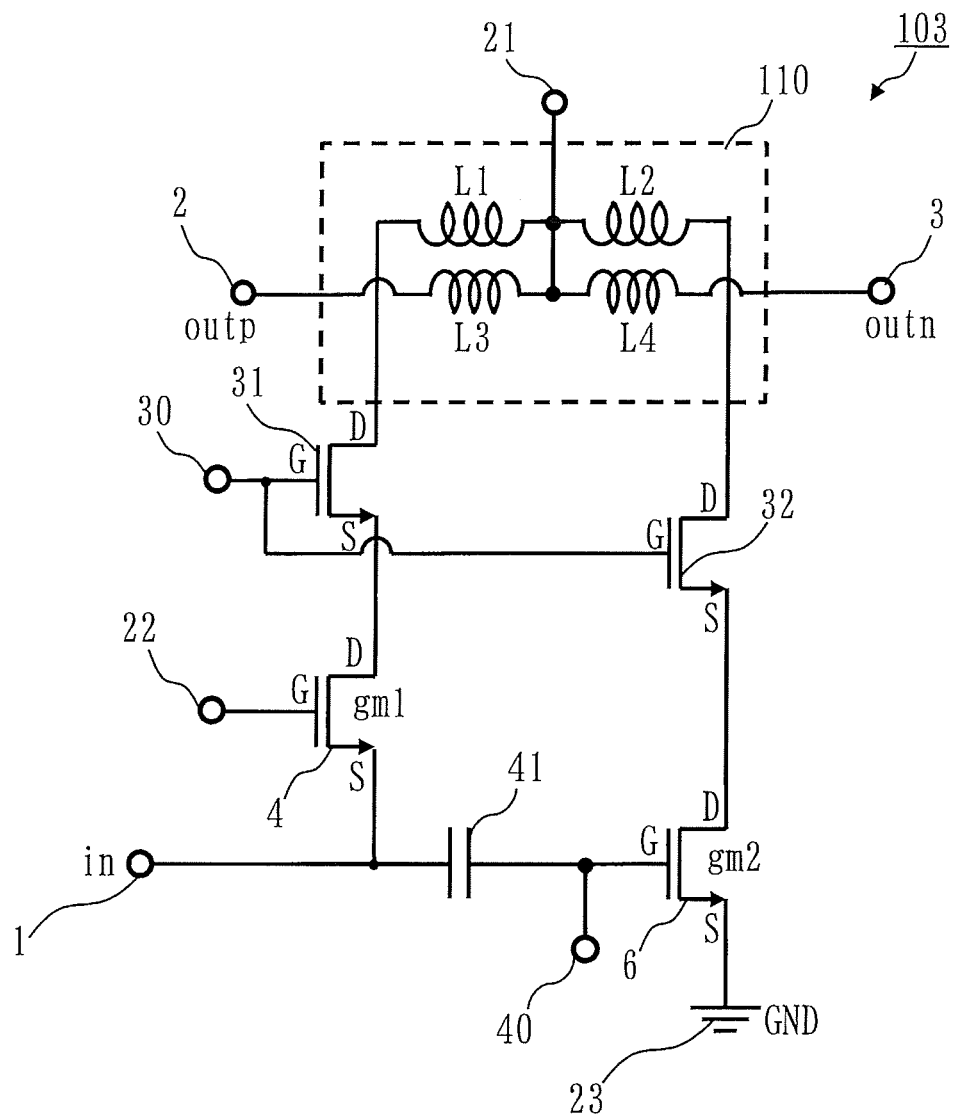
FIG. 5 is a circuit diagram illustrating a configuration of an active balun circuit 103 according to Embodiment 3.

FIG. 5 is a circuit diagram illustrating a configuration of an active balun circuit 103 according to this embodiment.

In the active balun circuit 103 illustrated in FIG. 5, a configuration capable of setting a bias voltage for the CS transistor 6 is added to the active balun circuit 102 described in Embodiment 2.

Referring to FIG. 5, the active balun circuit 103 includes a bias terminal 40 disposed between the input terminal 1 and the gate terminal of the CS transistor 6 and a capacitor 41 disposed between the bias terminal 40 and the input terminal 1.

As mentioned above, the capacitor 41 is inserted between the input terminal 1 and the gate terminal of the CS transistor 6, and the bias voltage is supplied from the bias terminal 40 to the gate terminal of the CS transistor 6.

Referring to FIG. 5, it is so arranged that the bias terminal 40 and the capacitor 41 are added to the active balun circuit 102 described in Embodiment 2. However, it may also be so arranged that the bias terminal 40 and the capacitor 41 are added to the active balun circuit 100 described in Embodiment 1.

As mentioned above, according to the active balun circuit 103 in this embodiment, an operation region of the CS transistor 6 is not affected by a voltage range of the input terminal 1. The CS transistor 6 may be operated in a gate voltage range of the CS transistor 6 with high linearity. With this arrangement, an inverted signal of an input signal with a lower distortion may be obtained. Thus, there is an effect that low-distortion differential signals are obtained.

Embodiment 4

In this embodiment, a difference from Embodiments 1 to 3 will be mainly described.

In this embodiment, by assigning same reference numerals to components that are the same as the components described in Embodiments 1 to 3, description of the same components may be omitted.

In this embodiment, a description will be given about a configuration in which a part or all of the transistors have been changed from the field effect type transistors to junction type (bipolar type) transistors in each of the active balun circuits 100, 102, and 103 in Embodiments 1 to 3.

Figure 6:
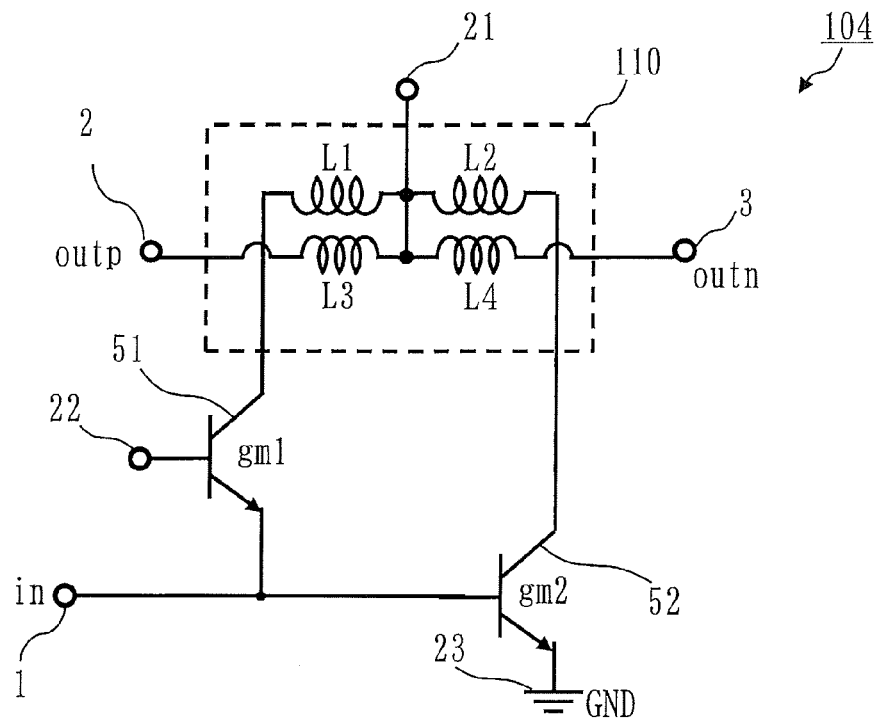
FIG. 6 is a circuit diagram illustrating a configuration of an active balun circuit 104 according to Embodiment 4.
Figure 7:
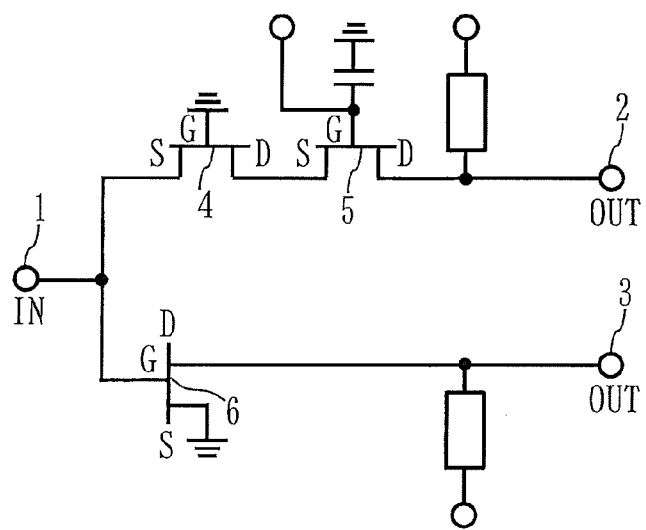
FIG. 7 is a circuit diagram illustrating a configuration of an active balun circuit for comparison.

FIG. 6 is a circuit diagram illustrating a configuration of an active balun circuit 104 according to this embodiment.

In the active balun circuit 104 illustrated in FIG. 6, all the field effect type transistors that are mounted on the active balun circuit 104 are changed to the junction type transistors. The active balun circuit 104 includes a junction type transistor 51 in place of the CG transistor 4, and includes a junction type transistor 52 in place of the CS transistor 6.

The junction type transistor 51 is an example of a base-grounded first junction type transistor in which an emitter terminal is connected to the input terminal 1 and a base terminal is used as a common terminal (grounded).

The junction type transistor 52 is an example of an emitter-grounded second junction type transistor in which a base terminal is connected to the input terminal 1 and an emitter terminal is used as a common terminal (grounded).

The junction type transistors 51 and 52 according to this embodiment are configured and operate in the same manner as the CG transistor 4 and the CS transistor 6 in Embodiments 1 to 3 by replacing the gate terminals by the base terminals, replacing the source terminals by the emitter terminals, and replacing the drain terminals by collector terminals.

The description has been given about the configuration in FIG. 6 in which the field effect type transistors used in the active balun circuit 100 described in Embodiment 1 have been all changed to the junction type transistors. The field effect type transistors used in each of the active balun circuits 102 and 103 described in Embodiments 2 and 3 may be, however, changed to the junction type transistors.

All of the transistors in each of the active balun circuits 100, 102, and 103 in Embodiments 1 to 3 may be changed from a field effect type to a junction type. Alternatively, a part of the transistors in each of the active balun circuits 100, 102, and 103 in Embodiments 1 to 3 may be changed from the field effect type to the junction type.

As mentioned above, by changing the part or all of the transistors in each of the active balun circuits 100, 102, and 103 in Embodiments 1 to 3 from the field effect type to the junction type, a signal current value of each transistor may be increased, so that effects of gain improvement and noise reduction may be obtained.

As described above, according to the active balun circuits 100, 102, 103, and 104 in Embodiments 1 to 4, a characteristic with low noise and high conversion accuracy (in the amplitudes and phases of the differential signals) may be obtained. Further, by generating with high performance the differential signals that may reduce noise influence, from the single-ended signal input through the antenna, reception sensitivity of a radio apparatus or a radar may be improved.

The above description has been given about the embodiments of the present invention. Two or more of the embodiments may be combined to be carried out. Alternatively, one of these embodiments may be partially carried out. Alternatively, two or more of these embodiments may be partially combined to be carried out.

The above-mentioned embodiments are essentially preferable exemplifications, and do not intend to limit an application and an application range of the present invention. Various modifications are possible as necessary. The present invention is not limited to these embodiments, and various modifications are possible as necessary.

REFERENCE SIGNS LIST

1: input terminal, 2, 3: output terminal, 4: CG transistor, 5: transistor, 6: CS transistor, 21, 22, 23: bias terminal, 30: bias terminal, 31, 32: cascode transistor, 40: bias terminal, 41: capacitor, 51, 52: junction type transistor 100, 101, 102, 103: active balun circuit, 110: asymmetrical transformer, L1, L2, L3, L4: inductor

The invention claimed is:

1. An active balun circuit comprising:
an input terminal to receive a single-ended signal;
a first field effect transistor having a source terminal thereof connected to the input terminal and a gate terminal thereof grounded;
a second field effect transistor having a gate terminal thereof connected to the input terminal and a source terminal thereof grounded;
a transformer including a primary coil and a secondary coil, the primary coil including a first coil connected to a drain terminal of the first field effect transistor and a second coil connected to a drain terminal of the second field effect transistor, the secondary coil including a third coil associated with the first coil and a fourth coil associated with the second coil;
a first output terminal connected to the third coil to output a signal generated at the third coil, as a first signal having a phase that is a same as a phase of the single-ended signal; and
a second output terminal connected to the fourth coil to output a signal generated at the fourth coil, as a second signal having a phase that is deviated from the phase of the single-ended signal by 180 degrees.

2. The active balun circuit according to claim 1, wherein an inductor value of the first coil is larger than an inductor value of the second coil.

3. The active balun circuit according to claim 1, wherein the inductor value of the first coil is within a range from twice to ten times the inductor value of the second coil.

4. The active balun circuit according to claim 1, wherein a transconductance value of the second field effect transistor is larger than a transconductance value of the first field effect transistor.

5. The active balun circuit according to claim 1, wherein the transconductance value of the second field effect transistor is within a range from twice to ten times the transconductance value of the first field effect transistor.

6. The active balun circuit according to claim 1, wherein an inductor value of the third coil is equal to an inductor value of the fourth coil.

7. The active balun circuit according to claim 1, comprising:
a bias terminal disposed between the input terminal and the gate terminal of the second field effect transistor; and
a capacitor disposed between the bias terminal and the input terminal.

8. The active balun circuit according to claim 1, comprising:
a third field effect transistor disposed between the first field effect transistor and the first coil, the third field effect transistor being cascode-connected to the first field effect transistor.

9. The active balun circuit according to claim 1, comprising:
a fourth field effect transistor disposed between the second field effect transistor and the second coil, the fourth field effect transistor being cascode-connected to the second field effect transistor.

10. An active balun circuit comprising:
an input terminal to receive a single-ended signal;
a first junction type transistor having an emitter terminal thereof connected to the input terminal and a base terminal thereof grounded;
a second junction type transistor having a base terminal thereof connected to the input terminal and an emitter terminal thereof grounded;
a transformer including a primary coil and a secondary coil, the primary coil including a first coil connected to a collector terminal of the first junction type transistor and a second coil connected to a collector terminal of the second junction type transistor, the secondary coil including a third coil associated with the first coil and a fourth coil associated with the second coil;
a first output terminal connected to the third coil to output a signal generated at the third coil, as a first signal; and
a second output terminal connected to the fourth coil to output a signal generated at the fourth coil, as a second signal having a phase that is deviated from a phase of the first signal by 180 degrees.

11. A transformer included by an active balun circuit to output a first signal and a second signal having a phase that is deviated from a phase of the first signal by 180 degrees, based on a single-ended signal input through an input terminal, the active balun circuit including a first field effect transistor having a source terminal thereof connected to the input terminal and a gate terminal thereof grounded and a second field effect transistor having a gate terminal thereof connected to the input terminal and a source terminal thereof grounded, the transformer comprising:
 a primary coil including a first coil connected to a drain terminal of the first field effect transistor and a second coil connected to a drain terminal of the second field effect transistor; and
 a secondary coil including a third coil associated with the first coil and a fourth coil associated with the second coil;
 the third coil being connected to a first output terminal to output a signal generated at the third coil, as the first signal;
 the fourth coil being connected to a second output terminal to output a signal generated at the fourth coil, as the second signal.

12. The transformer according to claim 11,
 wherein an inductor value of the first coil is larger than an inductor value of the second coil.

13. The active balun circuit according to claim 11,
 wherein the inductor value of the first coil is within a range from twice to ten times the inductor value of the second coil.

14. The transformer according to claim 11,
 wherein an inductor value of the third coil is equal to an inductor value of the fourth coil.

* * * * *